(12) United States Patent
Lee et al.

(10) Patent No.: US 10,366,884 B1
(45) Date of Patent: Jul. 30, 2019

(54) METHODS FOR FORMING A GERMANIUM ISLAND USING SELECTIVE EPITAXIAL GROWTH AND A SACRIFICIAL FILLING LAYER

(71) Applicant: Stratio, Seoul (KR)

(72) Inventors: Jaehyung Lee, Palo Alto, CA (US); Yeul Na, East Palo Alto, CA (US); Youngsik Kim, Seoul (KR)

(73) Assignee: STRATIO, Seoul (KR)

( * ) Notice: Subject to any disclaimer, the term of this patent is extended or adjusted under 35 U.S.C. 154(b) by 0 days.

(21) Appl. No.: 16/184,984

(22) Filed: Nov. 8, 2018

(51) Int. Cl.
| | |
|---|---|
| *H01L 21/02* | (2006.01) |
| *H01L 21/306* | (2006.01) |
| *H01L 21/3105* | (2006.01) |
| *H01L 21/8238* | (2006.01) |
| *H01L 23/532* | (2006.01) |
| *H01L 27/092* | (2006.01) |

(52) U.S. Cl.
CPC .. *H01L 21/02636* (2013.01); *H01L 21/02532* (2013.01); *H01L 21/02664* (2013.01); *H01L 21/30625* (2013.01); *H01L 21/31053* (2013.01); *H01L 21/823871* (2013.01); *H01L 21/823892* (2013.01); *H01L 23/53271* (2013.01); *H01L 27/092* (2013.01); *H01L 21/02381* (2013.01); *H01L 21/02488* (2013.01)

(58) Field of Classification Search
None
See application file for complete search history.

(56) References Cited

U.S. PATENT DOCUMENTS

| | | | |
|---|---|---|---|
| 7,875,958 B2 * | 1/2011 | Cheng | B82Y 10/00 257/190 |
| 8,173,551 B2 * | 5/2012 | Bai | C30B 25/183 438/758 |
| 9,378,950 B1 * | 6/2016 | Lee | H01L 21/3081 |
| 2006/0068557 A1 | 3/2006 | Ochimizu et al. | |
| 2007/0122954 A1 | 5/2007 | Liu et al. | |
| 2007/0218707 A1 | 9/2007 | Sadaka et al. | |

(Continued)

OTHER PUBLICATIONS

Lee, Notice of Allowance, U.S. Appl. No. 15/051,362, dated May 16, 2016, 8 pgs.

(Continued)

*Primary Examiner* — Shaun M Campbell
(74) *Attorney, Agent, or Firm* — Morgan, Lewis & Bockius LLP

(57) ABSTRACT

A method for obtaining a semiconductor island includes epitaxially growing a semiconductor structure over a substrate with a mask layer defining a region not covered by the mask layer. The semiconductor structure includes a first portion located adjacent to the mask layer and a second portion located away from the mask layer. The first portion has a first height that is less than a second height of a portion of the mask layer located adjacent to the first portion. The second portion has a third height that is equal to, or greater than, the second height. The method also includes forming a filling layer over at least the first portion; and, subsequently removing at least a portion of the semiconductor structure that is located above the second height. Devices made by this method are also disclosed.

19 Claims, 15 Drawing Sheets

(56) References Cited

U.S. PATENT DOCUMENTS

2013/0146830 A1    6/2013   Han et al.
2013/0255567 A1   10/2013   Wei et al.

OTHER PUBLICATIONS

Stratio, International Search Report and Written Opinion, PCT/US2016/33783, dated Aug. 18, 2016, 11 pgs.
Stratio, International Search Report and Written Opinion, PCT/US2018/60134, dated Jan. 17, 2019, 9 pgs.

* cited by examiner

- RELATED ART -

- RELATED ART -

- RELATED ART -

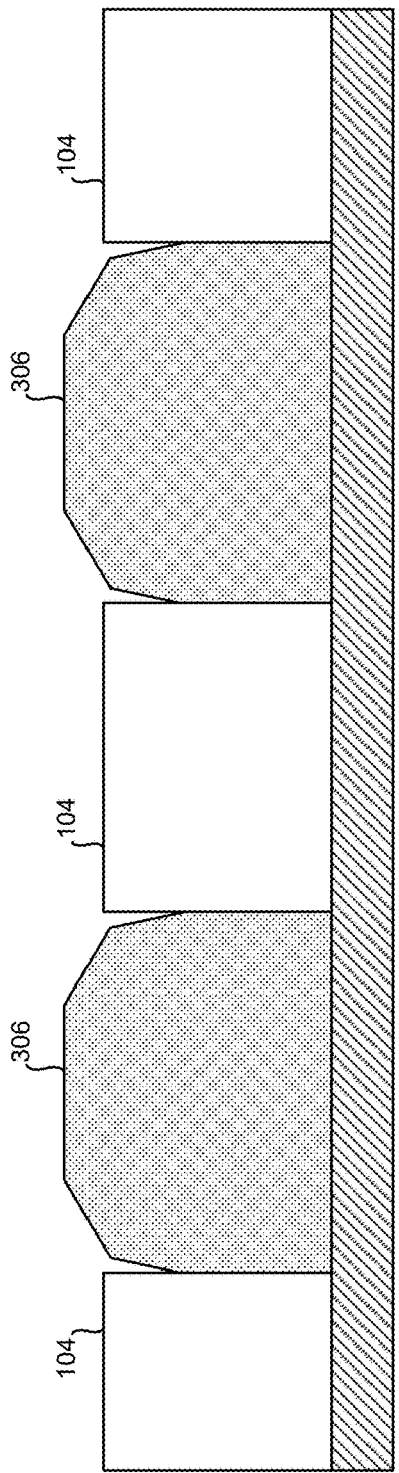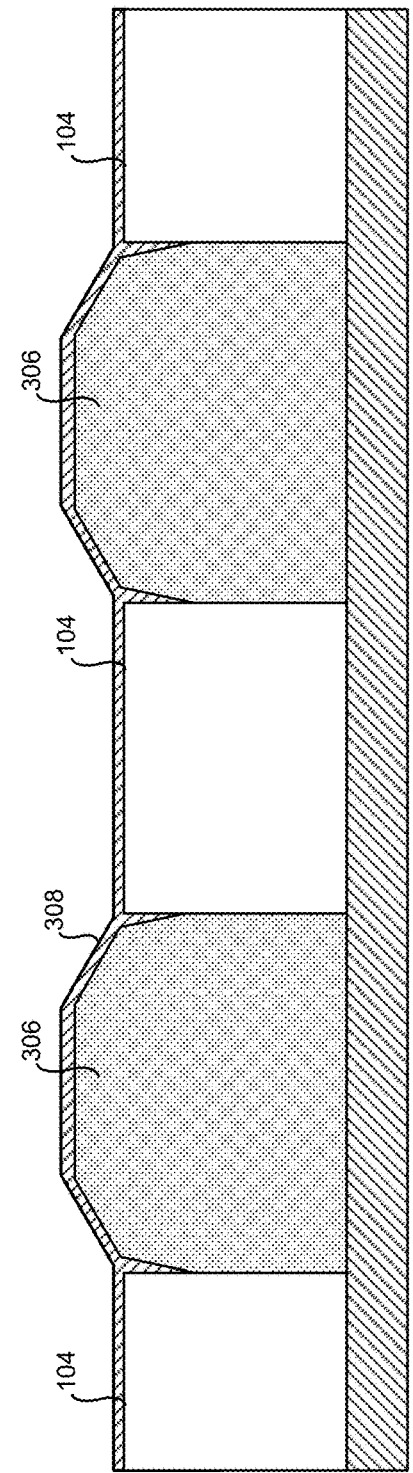

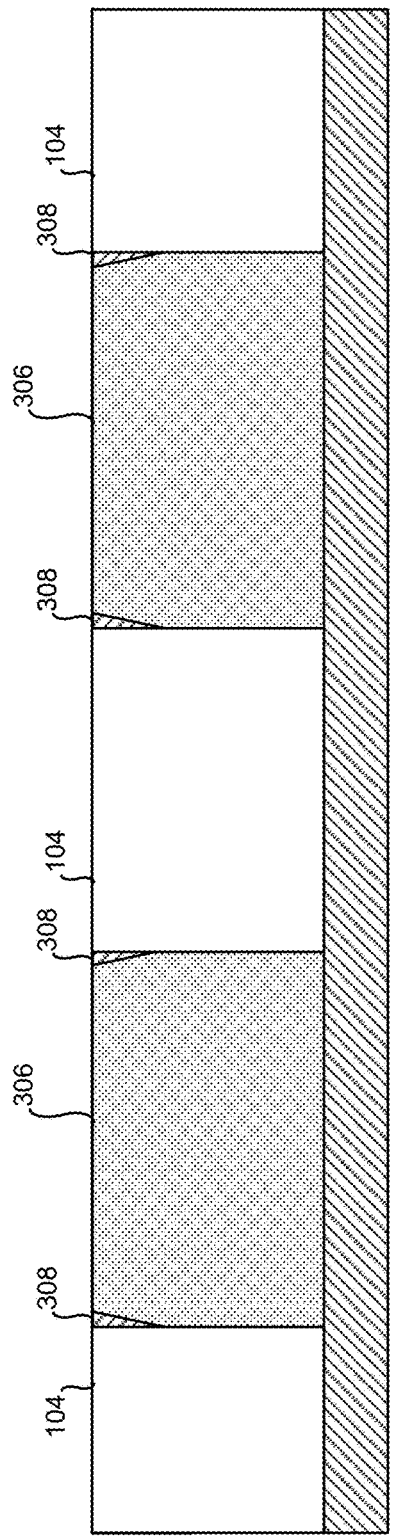
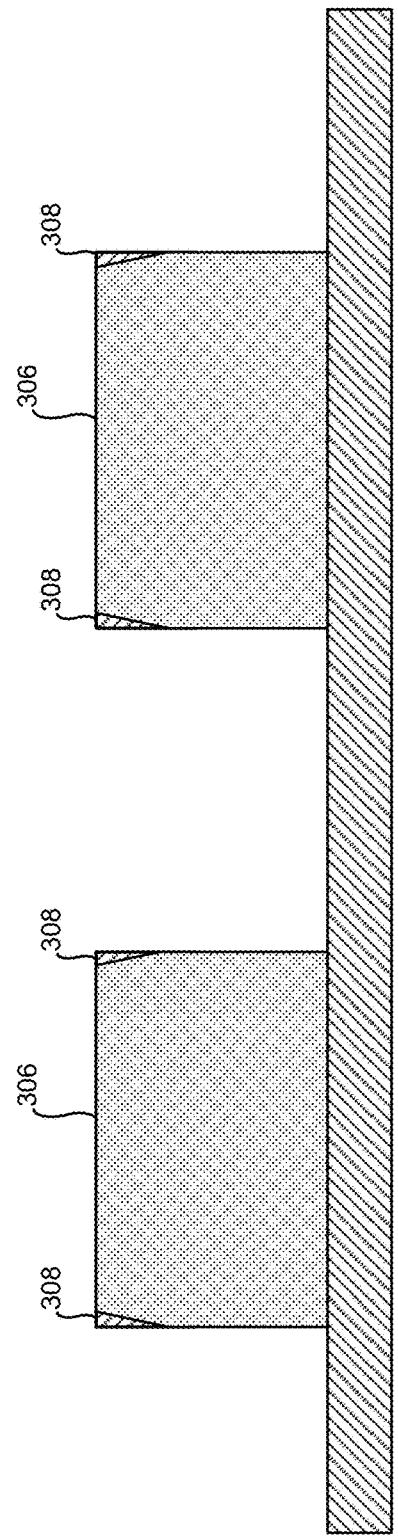
Figure 5C
Figure 5D

700

702 Epitaxially grow epitaxially growing one or more semiconductor structures over a substrate with one or more mask layers defining one or more regions that are not covered by the one or more mask layers over the substrate.

704 The one or more epitaxially grown semiconductor structures include germanium 706 The one or more mask layers include dielectric material 708 The one or more semiconductor structures are formed in a single epitaxial growth process 710 The substrate includes a plurality of semiconductor devices thereon 712 The plurality of semiconductor devices is located on the substrate below the one or more mask layers 714 The substrate includes a plurality of transistors thereon and a semiconductor structure of the one or more semiconductor structures is electrically coupled to a source or a drain of a transistor of the plurality of transistors 716 The substrate includes thereon a plurality of complementary metal-oxide semiconductor devices, including a p-type metal-oxide-semiconductor transistor and an n-type metal-oxide-semiconductor transistor 718 Electrically couple a first semiconductor structure of the one or more semiconductor structures to a source or a drain of one of: the p-type metal-oxide-semiconductor transistor or the n-type metal-oxide-semiconductor transistor

Figure 7A

720 Form one or more filling layers over at least the first portion of the respective epitaxially grown semiconductor structure 722 Forego removing at least a portion of the respective epitaxially grown semiconductor structure that is located above the height of the portion of the one or more mask layers located adjacent to the first portion of the respective epitaxially grown semiconductor structure prior to forming the one or more filling layers over at least the first portion of the respective epitaxially grown semiconductor structure.

724 The one or more filling layers includes a layer of polysilicon

726 Forming the one or more filling layers over at least the first portion of the respective epitaxially grown semiconductor structure includes forming at least one continuous filling layer over at least the first portion and the second portion of the respective epitaxially grown semiconductor structure and the portion of the one or more mask layers located adjacent to the first portion of the respective epitaxially grown semiconductor structure 728 The one or more semiconductor structures have crystalline structures and the one or more filling layers have amorphous and/ or poly-crystalline structures

Figure 7B

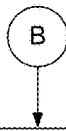

730 Subsequent to forming the one or more filling layers over at least the first portion of the respective epitaxially grown semiconductor structure, remove at least a portion of the respective epitaxially grown semiconductor structure that is located above the height of the portion of the one or more mask layers located adjacent to the first portion of the respective epitaxially grown semiconductor structure 732 Removing at least the portion of the respective epitaxially grown semiconductor structure includes planarizing at least the portion of the respective epitaxially grown semiconductor structure 734 The first portion has, before the removing operation, a first distance to the portion of the one or more mask layers located adjacent to the first portion along a plane located at the height of the portion of the one or more mask layers. The first portion has, after the removing operation, a second distance to the portion of the one or more mask layers located adjacent to the first portion along the plane located at the height of the portion of the one or more mask layers. The second distance is substantially identical to the first distance.

736 Subsequent to removing at least the portion of the respective epitaxially grown semiconductor structure, remove at least a portion of the one or more mask layers 738 Removing at least the portion of the one or more mask layers includes etching at least the portion of the one or more mask layers 740 Removing at least the portion of the one or more mask layers includes etching the entire one or more mask layers

Figure 7C

METHODS FOR FORMING A GERMANIUM ISLAND USING SELECTIVE EPITAXIAL GROWTH AND A SACRIFICIAL FILLING LAYER

GOVERNMENT LICENSE RIGHTS

This work was partially supported by Korea Institute of Planning and Evaluation for Technology in Food, Agriculture, Forestry (IPET) through High Value-added Food Technology Development Program, funded by Ministry of Agriculture, Food and Rural Affairs (MAFRA) (award no. 117062-3), the Institute for Information & communications Technology Promotion (IITP), funded by the Korea government (MSIT) (award no. 2016-0-00080), and the U.S. National Science Foundation (NSF) Small Business Innovation Research (SBIR) (award no. 1534793). The governments have certain rights in the invention.

RELATED APPLICATION

This application is related to U.S. patent application Ser. No. 15/051,362, filed Feb. 23, 2016, which issued as U.S. Pat. No. 9,378,950 on Jun. 28, 2016, which is incorporated by reference herein in its entirety.

TECHNICAL FIELD

This application relates generally to methods for manufacturing semiconductor devices. More particularly, the disclosed embodiments relate to methods for obtaining planarized semiconductor islands.

BACKGROUND

Epitaxial growth is a popular method of creating a crystalline region on a semiconductor substrate. However, formation of semiconductor structures in unwanted regions of the semiconductor substrate is undesirable.

Selective epitaxial growth (SEG) is used for creating a crystalline region on targeted areas of the semiconductor substrate. For a selective epitaxial growth, a semiconductor substrate is covered with a masking material, exposing certain areas of the underlying substrate. For such semiconductor substrate, the epitaxial growth occurs mainly on the exposed areas of the semiconductor substrate, and less so on the masking material.

However, certain semiconductor materials, when epitaxially grown, form non-flat top surfaces. On the other hand, many semiconductor devices require a flat surface to build additional semiconductor structures thereon, which, in turn, requires additional operations to planarize the semiconductor structures with non-flat top surfaces. Such additional operations can be time-consuming and costly, and may cause damages to the semiconductor structures.

SUMMARY

Thus, there is a need for improved methods of obtaining epitaxially grown semiconductor structures with planar top surfaces. A number of embodiments that overcome the limitations and disadvantages described above are presented in more detail below. These embodiments provide improved methods for making such semiconductor structures and devices that include such semiconductor structures. Such improved methods would also enable a faster process in obtaining epitaxially grown semiconductor structures with planar top surfaces while reducing damages caused by planarization operations, thereby increasing the yield in making devices with such semiconductor structures.

As described in more detail below, some embodiments involve a method for obtaining a semiconductor island. The method includes epitaxially growing one or more semiconductor structures over a substrate with one or more mask layers defining one or more regions that are not covered by the one or more mask layers over the substrate. The one or more semiconductor structures are epitaxially grown over the one or more regions that are not covered by the one or more mask layers. A respective epitaxially grown semiconductor structure of the one or more epitaxially grown semiconductor structures includes a first portion located adjacent to the one or more mask layers and a second portion located away from the one or more mask layers. The first portion of the respective epitaxially grown semiconductor structure has a height that is less than a height of a portion of the one or more mask layers located adjacent to the first portion of the respective epitaxially grown semiconductor structure. The second portion of the respective epitaxially grown semiconductor structure has a height that is equal to, or greater than, the height of the portion of the one or more mask layers located adjacent to the first portion of the respective epitaxially grown semiconductor structure. The method also includes forming one or more filling layers over at least the first portion of the respective epitaxially grown semiconductor structure; and, subsequent to forming the one or more filling layers over at least the first portion of the respective epitaxially grown semiconductor structure, removing at least a portion of the respective epitaxially grown semiconductor structure that is located above the height of the portion of the one or more mask layers located adjacent to the first portion of the respective epitaxially grown semiconductor structure.

In accordance with some embodiments, a semiconductor device includes substrate and one or more semiconductor layers defining one or more regions that are not covered by the one or more semiconductor layers over the substrate. The one or more semiconductor layers include silicon. The semiconductor device also includes one or more semiconductor structures located over the one or more regions that are not covered by the one or more semiconductor layers. The one or more semiconductor structures includes germanium. A respective semiconductor structure of the one or more semiconductor structures includes a first portion located adjacent to the one or more semiconductor layers and a second portion located away from the one or more semiconductor layers. The first portion of the respective semiconductor structure has a height that is less than a height of a portion of the one or more semiconductor layers located adjacent to the first portion of the respective semiconductor structure. The second portion of the respective semiconductor structure has a height that is equal to, or greater than, the height of the portion of the one or more semiconductor layers located adjacent to the first portion of the respective semiconductor structure. The semiconductor device further includes one or more filling layers located over at least the first portion of the respective semiconductor structure.

In accordance with some embodiments, a semiconductor device includes a substrate and one or more first semiconductor structures located over the substrate. A respective first semiconductor structure of the one or more first semiconductor structures has a substantially flat top surface, a substantially vertical side surface, and a diagonal surface extending from the top surface to the side surface. The diagonal surface is non-parallel and non-perpendicular to the top surface and non-parallel and non-perpendicular to the side surface. The semiconductor device also includes one or more second semiconductor structures. A respective second semiconductor structure of the one or more second semiconductor structures is located on the diagonal surface of a corresponding first semiconductor structure of the one or more first semiconductor structures. The respective second semiconductor structure has a side surface aligned with the side surface of the corresponding first semiconductor structure and a top surface aligned with the top surface of the corresponding first semiconductor structure.

In accordance with some embodiments, a semiconductor device is made by any method described herein.

BRIEF DESCRIPTION OF THE DRAWINGS

For a better understanding of the aforementioned aspects as well as additional aspects and embodiments thereof, reference should be made to the Description of Embodiments below, in conjunction with the following drawings.

FIGS. 5A-5D are partial cross-sectional views of a semiconductor substrate, illustrating a method of obtaining semiconductor islands in accordance with some embodiments.

FIGS. 7A-7C are flow diagrams illustrating a method of obtaining a semiconductor island in accordance with some embodiments.

Like reference numerals refer to corresponding parts throughout the figures.

Figure 1A:
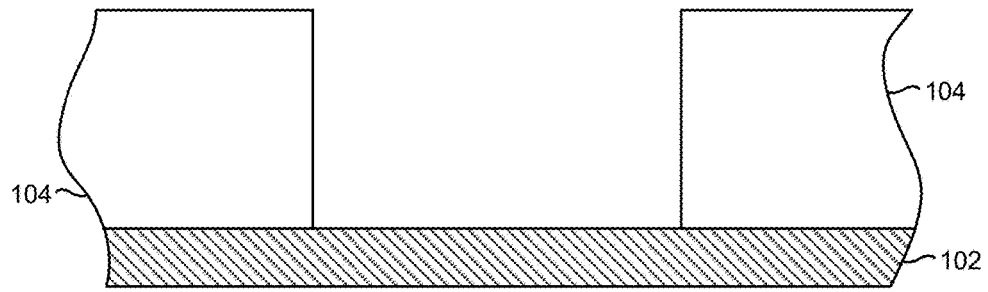
FIGS. 1A-1D are partial cross-sectional views of a semiconductor substrate, illustrating a method of obtaining a semiconductor island in accordance with some embodiments.

Unless noted otherwise, the figures are not drawn to scale.

DESCRIPTION OF EMBODIMENTS

As explained above, selective epitaxial growth (SEG) can be used for creating a crystalline region on targeted areas of the semiconductor substrate. However, certain semiconductor materials, such as germanium, when epitaxially grown, form a pyramid shaped structure. This is because the speed of the germanium growth has a very high dependency on the crystalline direction. In many cases, germanium grows faster in the first dominant direction (100) than the second dominant direction (311). This discrepancy of the growth speed leads to a germanium island having a pyramid shape. This pyramid-shaped germanium island is unsuitable for many semiconductor applications, which require a flat surface for fabricating additional semiconductor structures thereon. Without a flat surface, both the performance and the yield of a semiconductor device that includes the pyramid-shaped germanium island are severely impaired.

In addition, although a planarization operation, such as a chemical-mechanical-planarization process, can be used to remove a portion of the pyramid-shaped germanium island to provide a germanium island with a flat top surface, the pyramid-shaped germanium island can have a height over a micrometer, which is time-consuming and costly to planarize. Furthermore, such extensive planarization operation can cause damages (e.g., cracks or breakage) in the germanium island and/or adjacent structures.

Underfilling regions selected for selective epitaxial growth (e.g., regions not covered by a mask layer) with the epitaxially grown germanium island can lower the height of the pyramid-shaped germanium island, which requires less time spent on planarization operations. However, if the epitaxially grown germanium island is located entirely below the top surface of the mask layer, forming electrical contacts with the epitaxially grown germanium island can add challenges. In addition, the epitaxially grown germanium, due to the sloped facets, has a flat region that is substantially less than (e.g., less than 80%) the entire top surface, which, in turn, leads to additional challenges. If the epitaxially grown germanium island is located at least partially above the top surface of the mask layer, planarization is often required to level the top surface of the germanium island to the top surface of the mask layer. However, planarizing an underfilled semiconductor island can cause damages to the semiconductor island. In addition, the planarization operation on an underfilled semiconductor island can increase the gap between the semiconductor island and the mask layer, which changes or impairs the performance of a semiconductor device that includes the semiconductor island. For example, an electrical contact formed over the increased gap may be more susceptible to a mechanical force (e.g., due to a thermal expansion and/or shrinking, an external shock, etc.) and may break more easily.

Methods that address the above problems are described herein. Because a semiconductor structure is epitaxially grown without overfilling a region selected for selective epitaxial growth, the height of the epitaxially grown semiconductor structure is lower than the height of a semiconductor structure epitaxially grown to overfill the region. This reduces the amount of semiconductor material that needs to be removed during the planarization operation. In addition, a sacrificial layer is used to provide mechanical support to the epitaxially grown semiconductor structure, which preserves the integrity of the semiconductor structure and reduces damages during the planarization operation. Thus, the disclosed methods enable faster and more cost effective ways to provide epitaxially grown semiconductor structures (e.g., germanium structures) at a high yield.

Reference will be made to certain embodiments, examples of which are illustrated in the accompanying drawings. While the underlying principles will be described in conjunction with the embodiments, it will be understood that it is not intended to limit the scope of claims to these particular embodiments alone. On the contrary, the claims are intended to cover alternatives, modifications and equivalents that are within the scope of the claims.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well-known to those of ordinary skill in the art are not described in detail to avoid obscuring aspects of the underlying principles.

It will also be understood that, although the terms first, second, etc. may be used herein to describe various elements, these elements should not be limited by these terms. These terms are only used to distinguish one element from another. For example, a first group could be termed a second group, and, similarly, a second group could be termed a first group, without departing from the scope of the claims. The first group and the second group are both groups (e.g., of semiconductor structures), but they are not the same group.

The terminology used in the description of the embodiments herein is for the purpose of describing particular embodiments only and is not intended to limiting of the scope of claims. As used in the description and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIGS. 1A-1D are partial cross-sectional views of a semiconductor substrate, illustrating a method of obtaining a semiconductor island in accordance with some embodiments.

FIG. 1A illustrates a substrate 102 and a mask layer 104 on the substrate 102. Although the substrate 102 is shown as a wafer in FIGS. 1A-1D, 3A-3G, and 5A-5D, the substrate 102 may include additional features not shown in FIGS. 1A-1D, 3A-3G, and 5A-5D. In some embodiments, the substrate 102 includes silicon devices (e.g., silicon complementary metal-oxide-semiconductor devices as well as any other structures typically formed during the front-end of the line (FEOL) processes). In some embodiments, the substrate 102 includes an oxide layer on the silicon devices (e.g., FIGS. 6A-6F).

In some embodiments, the mask layer 104 includes a dielectric material (e.g., silicon dioxide, germanium dioxide, etc.). In some embodiments, the mask layer 104 is made of (or consists of) a dielectric material (e.g., silicon dioxide, germanium dioxide, etc.). The mask layer 104 exposes one or more portions of the substrate 102. In some embodiments, the mask layer 104 (e.g., the dielectric material) is deposited on the substrate 102 and subsequently etched to expose the one or more portions (or regions) of the substrate 102 (e.g., for subsequent epitaxial growth over the exposed portions or regions). In some embodiments, the substrate 102 is further etched. In some cases, this further etching provides a surface more suitable for epitaxial growth.

Figure 1B:
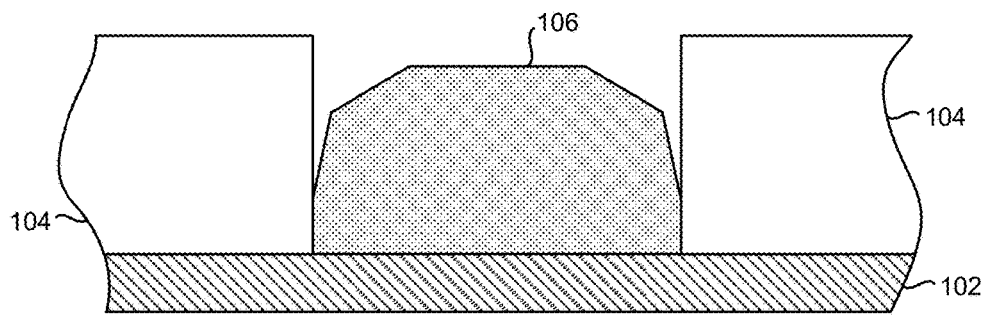

FIG. 1B illustrates that a semiconductor structure 106 (e.g., a germanium island) is epitaxially grown. The conditions (e.g., pressure, temperature, and chemical composition) for epitaxial growth of germanium are well known, and thus, are omitted herein for brevity. In some embodiments, the methods described herein do not require the use of an etchant (e.g., HCl gas) to suppress growth of semiconductor structures on the mask layer 104 during the epitaxial growth, although the use of an etchant is not precluded. In some embodiments, the methods include using an etchant during the epitaxial growth. The conditions for epitaxial growth can be adjusted to obtain the desired growth profile. Thus, it is possible to customize the shape of the epitaxially grown semiconductor structures. In some embodiments, the epitaxial growth is performed at a temperature between 350 and 650° C. In some embodiments, the epitaxial growth is performed at a pressure between 20 Torr and 150 Torr.

Figure 1C:
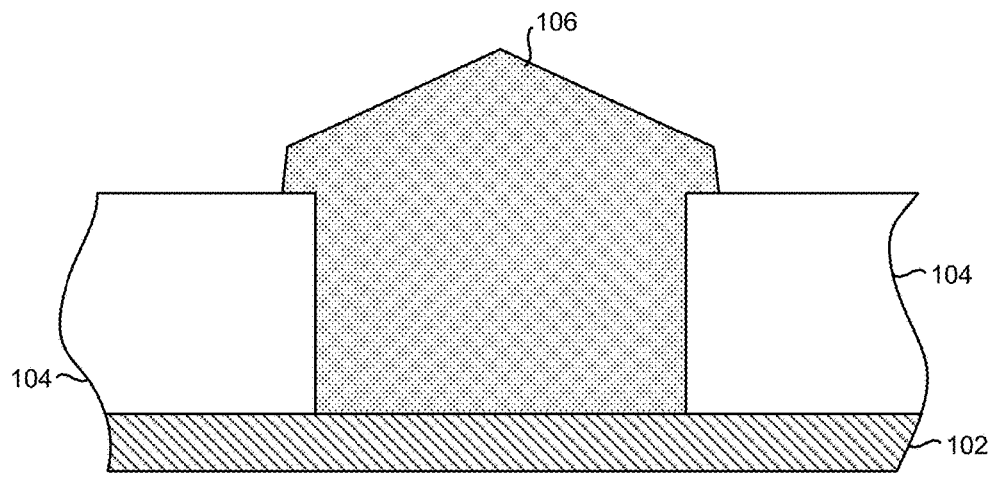

FIG. 1C illustrates that the semiconductor structure 106 continues to grow. FIG. 1C also illustrates that the semiconductor structure 106 has completely filled the region defined by the mask layer 104 (e.g., the opening in the mask layer 104). The semiconductor structure 106 in FIG. 1C has a pyramid-like shape at a level above the mask layer 104 (e.g., the semiconductor structure 106 has sloped top surfaces that meet at an apex). FIG. 1E is an example scanning electron microscope (SEM) image of a cross-section of a semiconductor substrate with an overgrown germanium island formed by epitaxial growth.

Figure 1D:
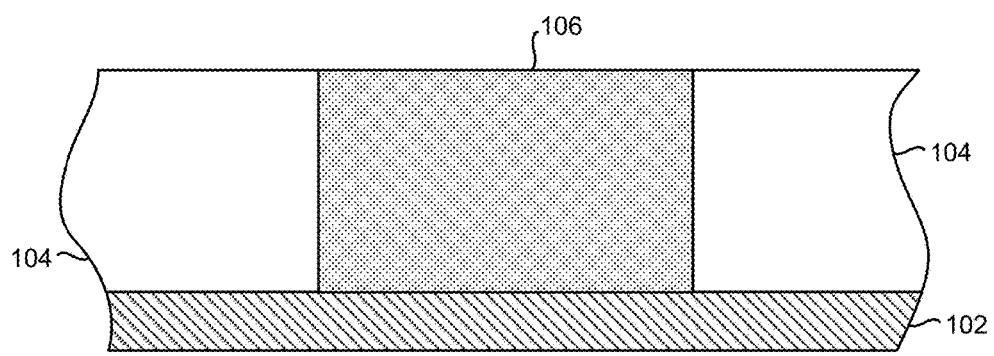
Figure 1E:
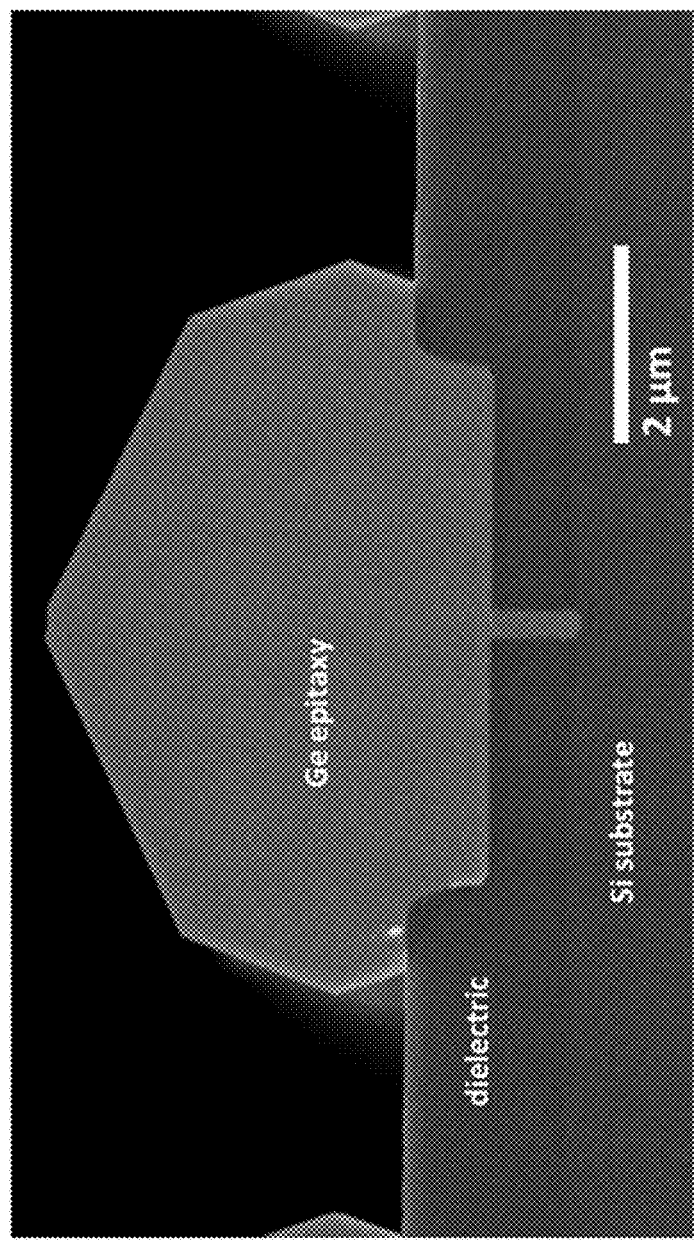
FIG. 1E is an example scanning electron microscope image of a cross-section of a semiconductor substrate with an epitaxially grown germanium island.

FIG. 1D illustrates that the semiconductor structure 106 is planarized (e.g., using a chemical-mechanical-planarization operation) so that the top surface of the semiconductor structure 106 is level with the top surface of the mask layer 104. However, this requires a significant equipment time to remove the entire portion of the pyramid-shaped semiconductor structure 106 that is located above the top surface of the mask layer 104.

Figures 2A, 2B:
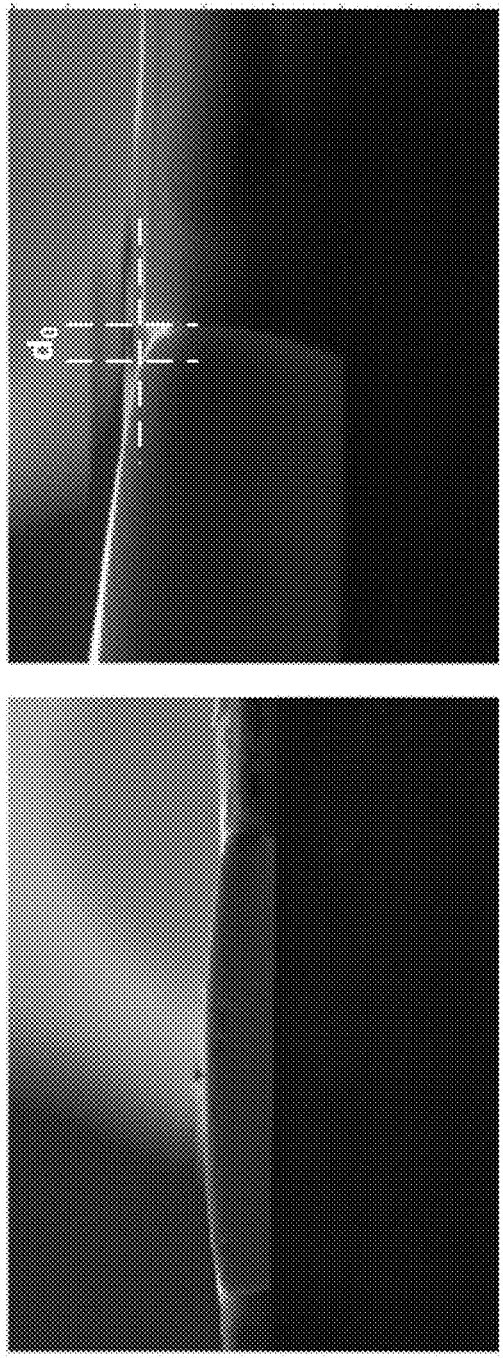
FIGS. 2A and 2B are scanning electron microscope images of a cross-section of a semiconductor substrate with a planarized germanium island in accordance with some embodiments.

FIG. 2A is a scanning electron microscope image of a cross-section of a semiconductor substrate with a planarized germanium island in accordance with some embodiments. FIG. 2B is an enlarged view of the image shown in FIG. 2A.

As shown in FIG. 2A, even after the planarization operation (e.g., the chemical-mechanical-planarization), the top surface of the semiconductor structure is not flat (e.g., curved).

In addition, as shown in FIG. 2B, the planarization operation has increased the gap between the semiconductor structure and the mask layer. After the planarization operation, the distance do between the semiconductor structure and the mask layer on a plane located on top of the mask layer is greater than a distance (e.g., the distance $d_1$ shown in FIG. 3D) between the semiconductor structure and the mask layer on the plane located on top of the mask layer. Without limiting the scope of claims, it is believed that the planarization operation causes rounding of the portion of the semiconductor structure near the mask layer, which, in turn, increases the distance between the semiconductor structure and the mask layer.

FIGS. 3A-3G are partial cross-sectional views of a semiconductor substrate, illustrating a method of obtaining a semiconductor island in accordance with some embodiments.

Figure 3A:
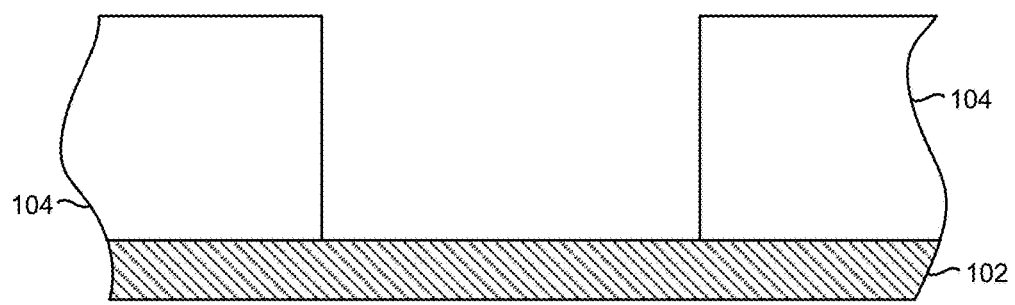
FIGS. 3A-3G are partial cross-sectional views of a semiconductor substrate, illustrating a method of obtaining a semiconductor island in accordance with some embodiments.
Figure 3B:
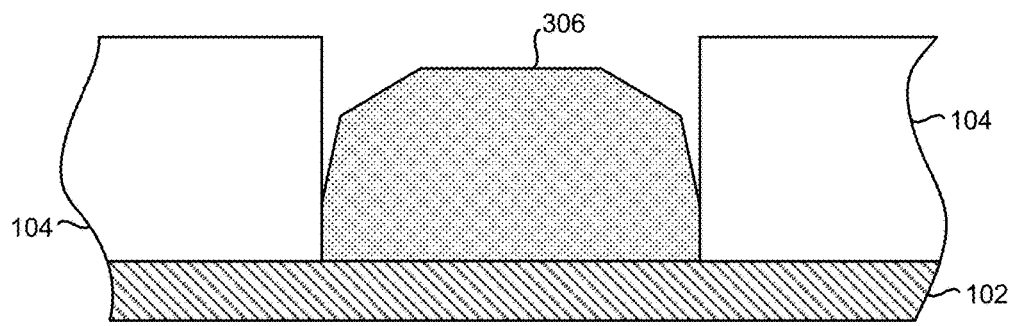

The processes illustrated in FIGS. 3A and 3B are similar to those illustrated in FIGS. 1A and 1B. For brevity, the description of these figures is not repeated herein.

Although now shown in FIG. 3A (or FIG. 1A), one or more additional layers (e.g., a silicon oxide layer) are located on the substrate 102 prior to epitaxial growth of the semiconductor structure 306 to facilitate the hetero-epitaxial growth (e.g., epitaxial growth of germanium over a silicon substrate) and suppress defects from the lattice mismatch. In some cases, the one or more additional layers are deposited on the substrate 102 before the mask layer 104 is placed over the substrate 102. In some embodiments, the one or more additional layers are formed on the substrate 102 after the mask layer 104 is placed over the substrate 102.

Also, although not shown in FIG. 3B (or FIG. 1B), additional semiconductor structures (e.g., particles, which are also called nuclei) are sometimes formed on the mask layer 104 during the epitaxial growth of the semiconductor structure 306. Such additional semiconductor structures often interfere with, or lowers, the performance of semiconductor devices that include the semiconductor structure 306. In some embodiments, such additional semiconductor structures are removed by the operations described in U.S. patent application Ser. No. 15/051,362, filed Feb. 23, 2016, which is incorporated by reference herein in its entirety. For brevity, the description of such operations is not repeated herein.

Figure 3C:
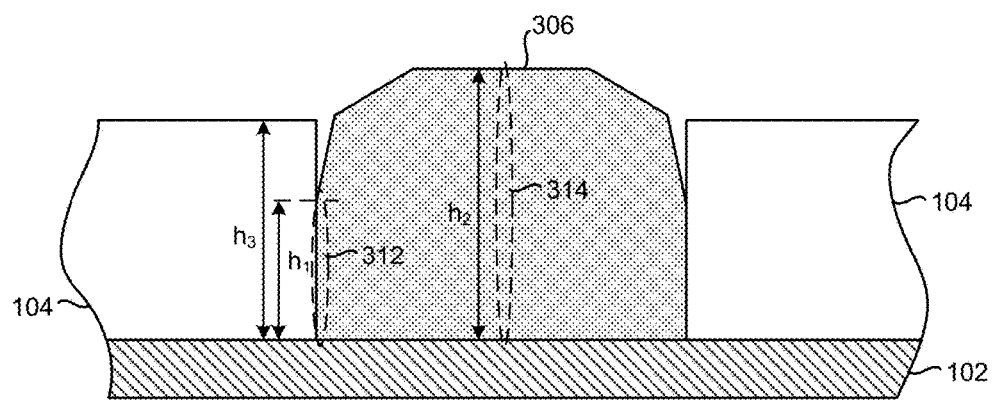

FIG. 3C illustrates that the semiconductor structure 306 continues to grow. In FIG. 3C, the semiconductor structure 306 does not fill the opening defined by the mask layer 104. In particular, the semiconductor structure 306 includes a first portion 312 that is located adjacent to the mask layer 104 (e.g., in some cases, the first portion 312 is in contact with the mask layer 104). The first portion 312 of the semiconductor structure 306 has a height $h_1$ that is less than a height $h_3$ of a portion of the mask layer 104 located adjacent to the first portion 312 of the semiconductor structure 306 (e.g., in some cases, the portion of the mask layer 104 located adjacent to the first portion 312 of the semiconductor structure 306 is in contact with the first portion 312 of the semiconductor structure 306).

At the same time, the semiconductor structure 306 has a second portion 314 (e.g., a horizontally-central vertical portion of the semiconductor structure 306) that is located away from the mask layer 104. The second portion 314 of the semiconductor structure 306 has a height $h_2$ that is equal to, or greater than, the height $h_3$ of the portion of the mask layer 104 located adjacent to the first portion 312 of the semiconductor structure 306. This facilitates forming additional semiconductor devices and/or electrical contacts over the semiconductor structure 306, even after the semiconductor structure 306 is planarized.

Figure 3D:
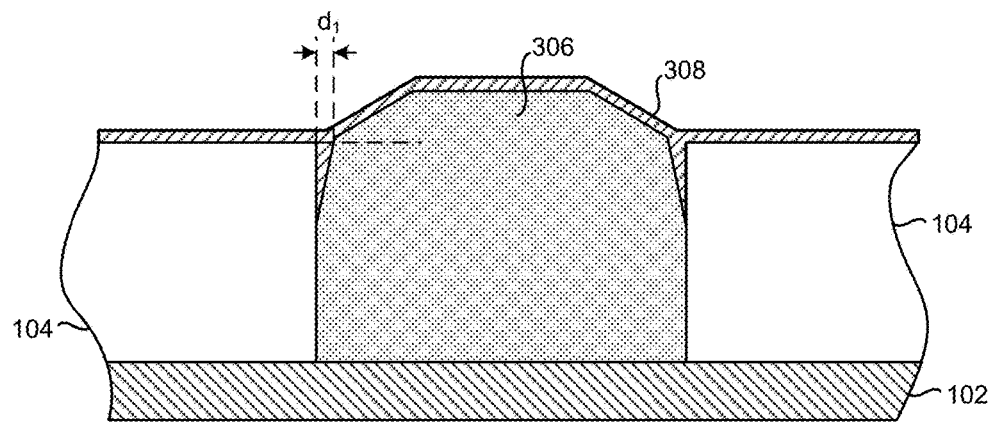

FIG. 3D illustrates that a filling layer 308 is formed over the semiconductor structure 306. In some embodiments, the filling layer 308 is a continuous layer. In some embodiments, the filling layer 308 is formed over the semiconductor structure 306 and the mask layer 104. In some embodiments, the filling layer 308 includes a dielectric material, such as oxide or nitride (e.g., silicon dioxide, silicon nitride, germanium oxide, or germanium nitride), or a polycrystalline or amorphous semiconductor material, such as polysilicon or poly-germanium. In some embodiments, the filling layer 308 is made of a material (e.g., polysilicon) that allows conformal deposition so that the filling layer 308 can fill the sharp crevice between the mask layer 104 and the semiconductor structure 306.

FIG. 3D also indicates that the semiconductor structure 306 has a distance $d_1$ to the mask layer 104 along a plane located at the height of the mask layer 104 (e.g., the plane is located on the top surface of the mask layer 104).

Figure 3E:
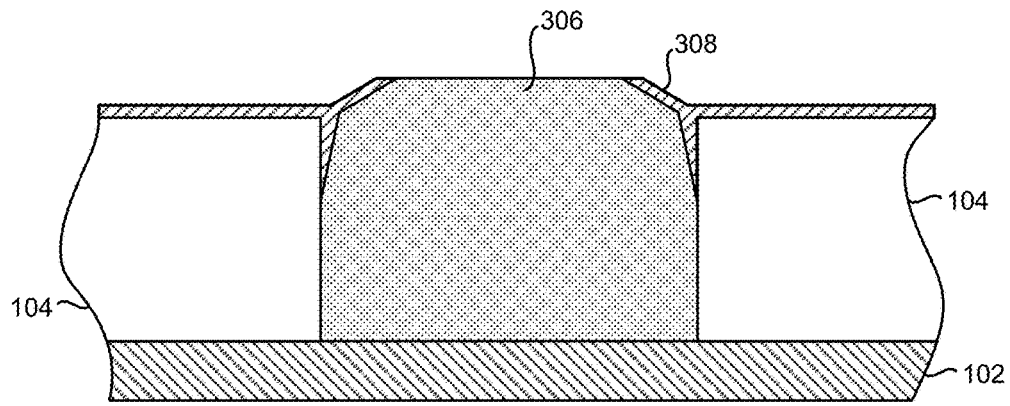

FIG. 3E illustrates that a portion of the filling layer 308 and a portion of the semiconductor structure 306 are removed (e.g., using a planarization operation, such as chemical-mechanical-planarization).

Figure 3F:
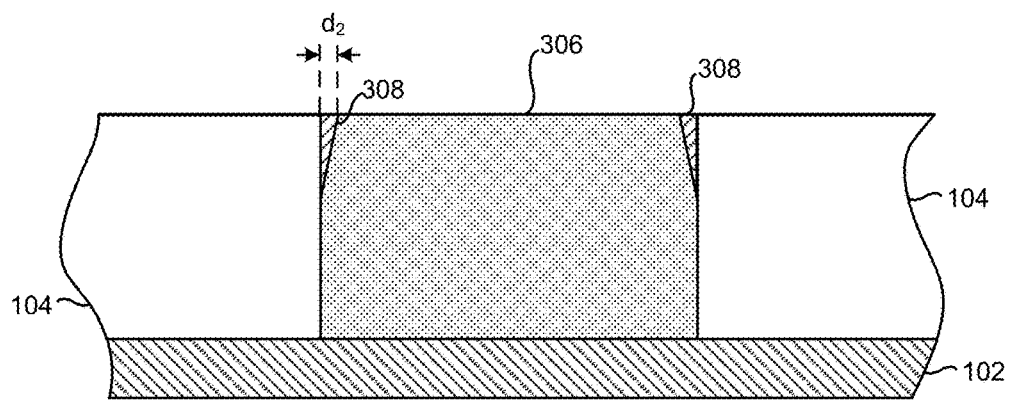

FIG. 3F illustrates that an additional portion of the filling layer 308 and an additional portion of the semiconductor structure 306 are removed (e.g., using a planarization operation, such as chemical-mechanical-planarization). In some embodiments, one or more portions of the mask layer 104 are also removed during the planarization operation.

FIG. 3F shows that the top surface of the semiconductor structure 306 is planar, and level with the top surface of the mask layer 104. In addition, the filling layer 308 prevented or reduced rounding of the sloped facet of the semiconductor structure 306. Thus, the semiconductor structure 306 shown in FIG. 3F has a distance $d_2$ to the mask layer 104 along the plane located at the height of the mask layer 104, and the distance $d_2$ corresponds substantially to distance $d_1$ (e.g., the distance $d_1$ is at least 80% of the distance $d_2$, or in some cases, at least 90%, 95%, 96%, 97%, 98%, 99%, 99.5%, or 99.9% of the distance $d_2$).

Figure 3G:
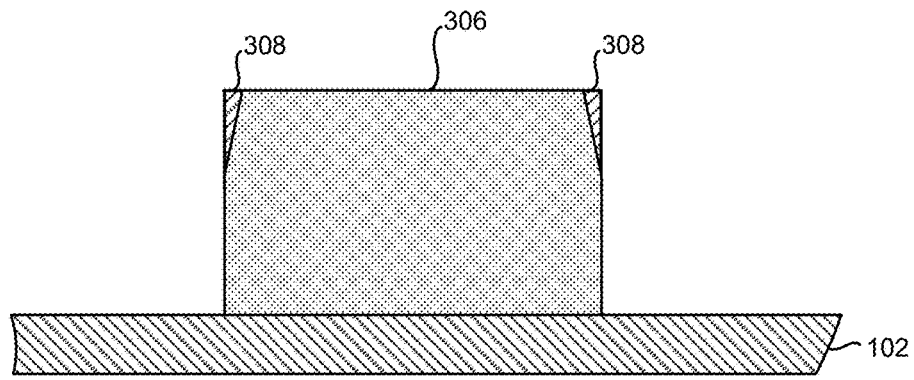

FIG. 3G illustrates that, in some cases, the mask layer 104 is removed (e.g., using an etching operation, such as a wet etch or a dry etch, that is specific to the material of the mask layer 104, such as an oxide).

Figure 4B:
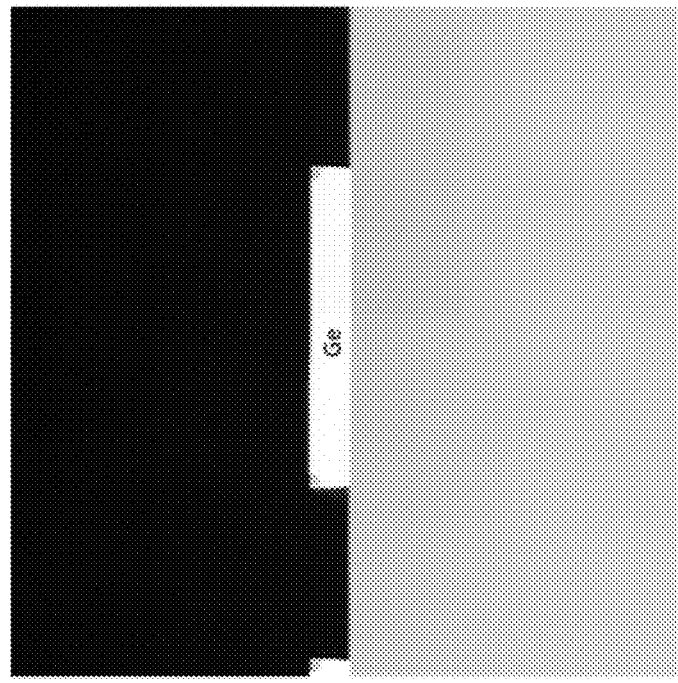
FIGS. 4A and 4B are scanning electron microscope images of cross-sections of semiconductor substrates processed with at least some of the operations shown in FIGS. 3A-3G in accordance with some embodiments.
Figure 4A:
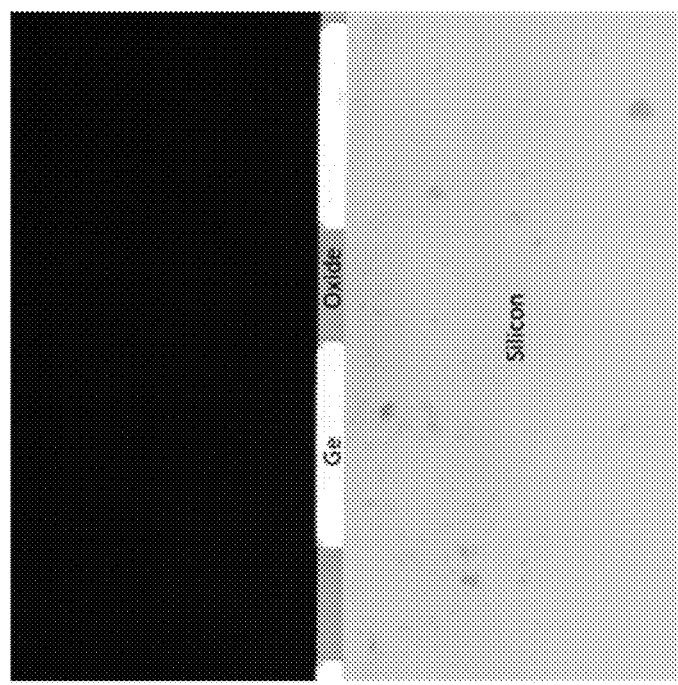

FIGS. 4A and 4B are scanning electron microscope images of cross-sections of semiconductor substrates processed with at least some of the operations shown in FIGS. 3A-3G in accordance with some embodiments.

FIG. 4A shows a cross-section of a semiconductor substrate with germanium islands on a silicon substrate, where the germanium islands are separated by an oxide layer (similar to the cross-section illustrated in FIG. 3F).

FIG. 4B shows a cross-section of a semiconductor substrate with germanium islands on a silicon substrate, where the oxide layer has been removed (similar to the cross-section illustrated in FIG. 3G).

FIGS. 5A-5D clarify that the operations illustrated in FIGS. 3A-3G can be performed in forming multiple semiconductor structures (e.g., germanium islands) on a single semiconductor substrate.

FIG. 5A illustrates that semiconductor structures 306 are epitaxially grown to a preselected height. FIG. 5B illustrates that a filling layer 308 is applied on the semiconductor structures 306. FIG. 5C illustrates that a portion of the filling layer 308 and portions of the semiconductor structures 306 are removed (e.g., by chemical-mechanical-planarization). FIG. 5D illustrates that the mask layer 104 is removed (e.g., etched).

Certain other features described with respect to FIGS. 3A-3G can be applied analogously to the processes illustrated in FIGS. 5A-5D. For brevity, such details are not repeated herein.

FIGS. 6A-6F are partial cross-sectional views of semiconductor substrates with semiconductor devices in accordance with some embodiments.

Figure 6A:
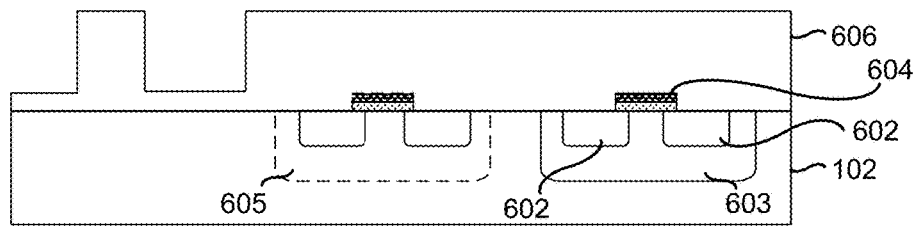
FIGS. 6A-6F are partial cross-sectional views of semiconductor substrates with semiconductor devices in accordance with some embodiments.

FIG. 6A illustrates that the substrate 102 includes complementary metal-oxide-semiconductor (CMOS) devices with source/drains 602 and gates 604. In FIG. 6A, a mask layer 606 (e.g., silicon dioxide) is formed on the substrate 102. In some embodiments, the mask layer 606 includes silicon dioxide of at least 2 μm thickness, for growing a germanium layer thereon. This particular thickness range for the silicon dioxide was found to improve the quality of the crystallinity of the epitaxially grown germanium.

The complementary metal oxide-semiconductor devices shown in FIG. 6A includes a PMOS transistor (e.g., a metal-oxide-semiconductor-field-effect transistor having a body in an n region and the source and drain in p+ regions) and an NMOS transistor (e.g., a metal-oxide-semiconductor-field-effect transistor having a body in a p region and the source and drain in n+ regions).

In some cases, the substrate 102 is a p-doped substrate and a portion of the substrate 102 is doped to form an n-well 603. Portions of the n-well 603 are doped (with p-type dopants) to form the source and drain of a PMOS transistor. Optionally, a portion of the substrate 102 is further doped (with p-type dopants) to form a p-well 605. Portions of the p-well 605 are doped (with n-type dopants) to form the source and drain of an NMOS transistor. Alternatively, portions of the p-doped substrate are doped (with n-type dopants), without further doping the p-doped substrate with p-type dopants, to form the source and drain of an NMOS transistor.

In some cases, the substrate 102 is a n-doped substrate and a portion of the substrate 102 is doped to form an p-well 603. Portions of the p-well 603 are doped (with n-type dopants) to form the source and drain of a NMOS transistor. Optionally, a portion of the substrate 102 is further doped (with n-type dopants) to form a n-well 605. Portions of the n-well 605 are doped (with p-type dopants) to form the source and drain of an PMOS transistor. Alternatively, portions of the n-doped substrate are doped (with p-type dopants), without further doping the n-doped substrate with n-type dopants, to form the source and drain of an PMOS transistor.

Figure 6B:
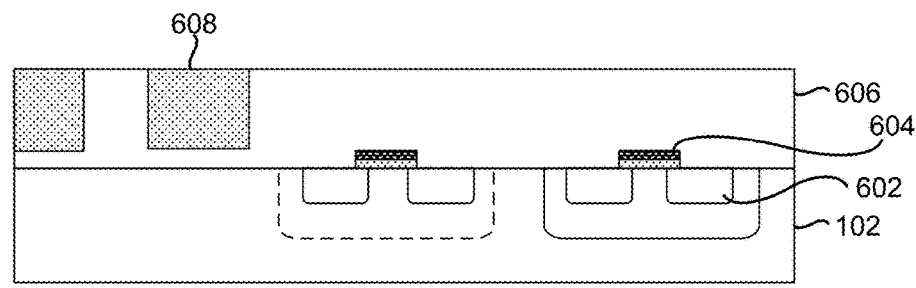

FIG. 6B illustrates that a semiconductor structure 608 (e.g., germanium) is formed using the processes described above with respect to FIGS. 3A-3F and 5A-5C.

Figure 6C:
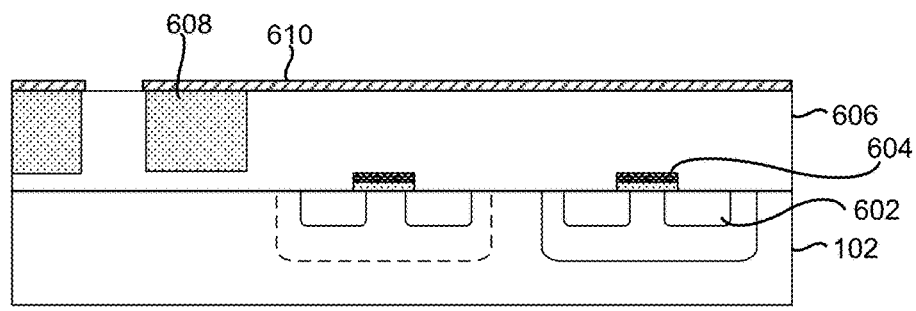

FIG. 6C illustrates that an additional structure 610 (e.g., a metal or semiconductor wire) is formed over the semiconductor structure 608.

Figure 6D:
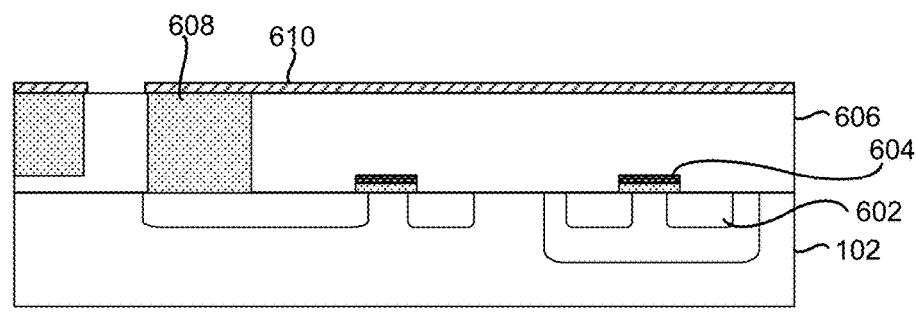

FIG. 6D is similar to FIG. 6C, except that the semiconductor structure 608 and a source or a drain of a transistor are electrically coupled (directly as shown in FIG. 6D or indirectly through one or more electrical wires, such as polysilicon wires). As shown in FIG. 6D, in some cases, the semiconductor structure 608 is formed (e.g., via epitaxial growth) directly on a substrate. In some embodiments, the semiconductor structure 608 is formed (e.g., via epitaxial growth) directly on a doped portion of the substrate, as shown in FIG. 6D.

Figure 6E:
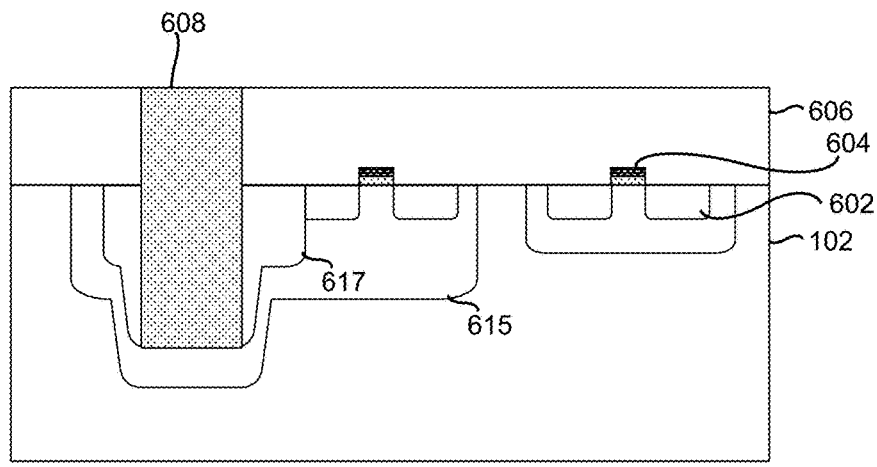

FIG. 6E illustrates that a deep well 615 is formed in the substrate 102. In some cases, at least a portion of the deep well 615 is further lowered by formation of one or more layers 617 of an oxide (e.g., a silicon dioxide) over the deep well 615. In some embodiments, the semiconductor structure 608 is formed to extend down to the deep well 615.

Figure 6F:
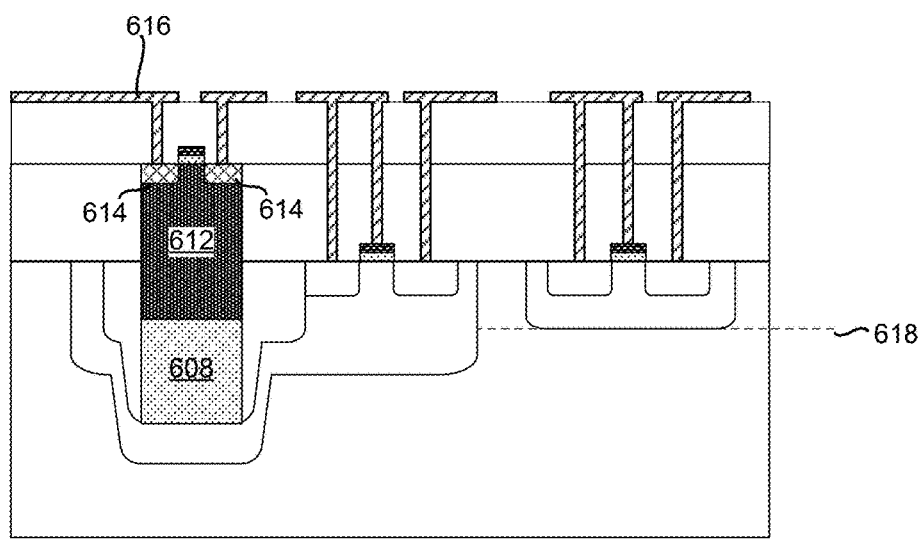

FIG. 6F illustrates that at least a portion of the semiconductor structure 608 is doped (e.g., with n-type or p-type dopants) to form a floating well 612, and the source and drain regions 614 within the floating well 612. FIG. 6F also illustrates that a gate region is formed over the floating well 612, one or more additional protective layers (e.g., an oxide layer) are deposited over the floating well 612 with the source and drain regions 612 and the gate region and the mask layer 606. FIG. 6F further illustrates that one or more additional structures 616 (e.g., metal or semiconductor wires) are formed over the one or more additional protective layers.

FIGS. 7A-7C are flow diagrams illustrating method 700 of obtaining a semiconductor island in accordance with some embodiments.

The method includes epitaxially growing (702) one or more semiconductor structures over a substrate with one or more mask layers defining one or more regions that are not covered by the one or more mask layers over the substrate (e.g., FIGS. 3A-3C). The one or more semiconductor structures are epitaxially grown over the one or more regions that are not covered by the one or more mask layers. A respective epitaxially grown semiconductor structure of the one or more epitaxially grown semiconductor structures includes a first portion (e.g., the first portion 312 in FIG. 3C) located adjacent to the one or more mask layers (e.g., the first portion is in contact with the one or more mask layers or is within 1 μm of the one or more mask layers) and a second portion (e.g., the second portion 314 in FIG. 3C) located away from (e.g., the second portion is located at least 1 μm away from the one or more mask layers) the one or more mask layers (e.g., the first portion 312 and the second portion 314 in FIG. 3C). The first portion of the respective epitaxially grown semiconductor structure has a height (e.g., the height $h_1$ in FIG. 3C) that is less than a height (e.g., the height $h_3$ in FIG. 3C) of a portion of the one or more mask layers located adjacent to the first portion of the respective epitaxially grown semiconductor structure. The second portion of the respective epitaxially grown semiconductor structure has a height (e.g., the height $h_2$ in FIG. 3C) that is equal to, or greater than, the height of the portion of the one or more mask layers located adjacent to the first portion of the respective epitaxially grown semiconductor structure.

In some embodiments, the one or more epitaxially grown semiconductor structures include (704) germanium. In some embodiments, the one or more epitaxially grown semiconductor structures consist of germanium. In some embodiments, the one or more epitaxially grown semiconductor structures include germanium, but they do not consist of germanium (e.g., the one or more epitaxially grown semiconductor structures also include a material that is not germanium).

In some embodiments, the one or more mask layers include (706) dielectric material (e.g., silicon dioxide, germanium dioxide, etc.).

In some embodiments, the one or more semiconductor structures are formed (708) in a single epitaxial growth process.

In some embodiments, the substrate includes (710) a plurality of semiconductor devices thereon (e.g., transistors as shown in FIG. 6A).

In some embodiments, the plurality of semiconductor devices is located (712) on the substrate below the one or more mask layers. In some embodiments, at least some of the plurality of semiconductor devices are at least partially embedded in the substrate.

In some embodiments, the substrate includes (714) a plurality of transistors thereon and a semiconductor structure of the one or more semiconductor structures is electrically coupled to a source or a drain of a transistor of the plurality of transistors (e.g., FIG. 6D).

In some embodiments, the substrate includes thereon (716) a plurality of complementary metal-oxide semiconductor devices, including a p-type metal-oxide-semiconductor transistor and an n-type metal-oxide-semiconductor transistor (e.g., FIG. 6A).

In some embodiments, the method further includes electrically coupling (718) a first semiconductor structure of the one or more semiconductor structures to a source or a drain of one of: the p-type metal-oxide-semiconductor transistor or the n-type metal-oxide-semiconductor transistor (e.g., FIG. 6D).

In some embodiments, a semiconductor structure of the one or more semiconductor structures extends below a horizontal plane defined by a bottom of a semiconductor device of the plurality of semiconductor devices (e.g., the semiconductor structure 608 extends below a horizontal plane 618 defined by the bottom of a MOS transistor).

The method also includes forming (720) one or more filling layers over at least the first portion of the respective epitaxially grown semiconductor structure (e.g., FIG. 6D).

In some embodiments, the method includes foregoing (722) removing at least a portion of the respective epitaxially grown semiconductor structure that is located above the height of the portion of the one or more mask layers located adjacent to the first portion of the respective epitaxially grown semiconductor structure prior to forming the one or more filling layers over at least the first portion of the respective epitaxially grown semiconductor structure.

In some embodiments, the one or more filling layers include (724) a layer of polysilicon.

In some embodiments, forming the one or more filling layers over at least the first portion of the respective epitaxially grown semiconductor structure includes forming (726) at least one continuous filling layer over at least the first portion and the second portion of the respective epitaxially grown semiconductor structure and the portion of the one or more mask layers located adjacent to the first portion of the respective epitaxially grown semiconductor structure (e.g., FIG. 3D).

In some embodiments, the one or more semiconductor structures have (728) crystalline structures and the one or more filling layers have amorphous and/or polycrystalline structures (e.g., the one or more semiconductor structures are crystalline germanium and the one or more filling layers are polysilicon).

The method further includes, subsequent to forming the one or more filling layers over at least the first portion of the respective epitaxially grown semiconductor structure, removing (730) at least a portion of the respective epitaxially grown semiconductor structure that is located above the height of the portion of the one or more mask layers located adjacent to the first portion of the respective epitaxially grown semiconductor structure (e.g., FIG. 3F).

In some embodiments, removing at least the portion of the respective epitaxially grown semiconductor structure includes planarizing (732) at least the portion of the respective epitaxially grown semiconductor structure.

In some embodiments, method also includes, subsequent to removing at least the portion of the respective epitaxially grown semiconductor structure, removing (736) at least a portion of the one or more mask layers (e.g., FIG. 3G).

In some embodiments, removing at least the portion of the one or more mask layers includes etching (738) at least the portion of the one or more mask layers.

In some embodiments, removing at least the portion of the one or more mask layers includes etching (740) the entire one or more mask layers (e.g., FIG. 3G).

In some embodiments, the respective epitaxially grown semiconductor structure has, before at least the portion of the respective epitaxially grown semiconductor structure that is located above the height of the portion of the one or more mask layers located adjacent to the first portion of the respective epitaxially grown semiconductor structure is removed, a first distance (e.g., the distance $d_1$ in FIG. 3D) to the portion of the one or more mask layers located adjacent to the first portion of the respective epitaxially grown semiconductor structure along a plane located at the height of the portion of the one or more mask layers located adjacent to the first portion of the respective epitaxially grown semiconductor structure. In some embodiments, the respective epitaxially grown semiconductor structure has, after at least the portion of the respective epitaxially grown semiconductor structure that is located above the height of the portion of the one or more mask layers located adjacent to the first portion of the respective epitaxially grown semiconductor structure is removed, a second distance (e.g., the distance $d_2$ in FIG. 3F) to the portion of the one or more mask layers located adjacent to the first portion of the respective epitaxially grown semiconductor structure along the plane located at the height of the portion of the one or more mask layers located adjacent to the first portion of the respective epitaxially grown semiconductor structure. The second distance is substantially identical to the first distance (e.g., the first distance is identical to the second distance or the first distance is at least 90%, 95%, 99%, 99.5%, or 99.9% of the second distance).

In accordance with some embodiments, a semiconductor device (e.g., the semiconductor device shown in FIG. 3F) includes a substrate (e.g., the substrate 102 in FIG. 3F) and one or more semiconductor layers (e.g., the mask layer 104 in FIG. 3F) defining one or more regions that are not covered by the one or more semiconductor layers over the substrate. The one or more semiconductor layers include silicon. The semiconductor device also includes one or more semiconductor structures (e.g., the semiconductor structure 306 in FIG. 3F) located over the one or more regions that are not covered by the one or more semiconductor layers. The one or more semiconductor structures includes germanium. A respective semiconductor structure of the one or more semiconductor structures includes a first portion located adjacent to the one or more semiconductor layers and a second portion located away from the one or more semiconductor layers. The first portion of the respective semiconductor structure has a height that is less than a height of a portion of the one or more semiconductor layers located adjacent to the first portion of the respective semiconductor structure (e.g., the portion of the semiconductor structure 306 in contact with the mask layer 104 has a height that is less than the height of the mask layer 104). The second portion of the respective semiconductor structure has a height that is equal to, or greater than, the height of the portion of the one or more semiconductor layers located adjacent to the first portion of the respective semiconductor structure (e.g., the portion of the semiconductor structure 306 in the middle of the semiconductor structure 306 has a height that is equal to the height of the mask layer 104 as shown in FIG. 3F or a height that is greater than the height of the mask layer 104 as shown in FIG. 3E). The semiconductor device further includes one or more filling layers located over at least the first portion of the respective semiconductor structure (e.g., the filling layer 308 located over the portion of the semiconductor structure 306 in contact with the mask layer 104).

In accordance with some embodiments, a semiconductor device (e.g., the semiconductor device shown in FIG. 3G) includes a substrate (e.g., the substrate 102 in FIG. 3G) and one or more first semiconductor structures (e.g., the semiconductor structure 306 in FIG. 3G) located over the substrate. A respective first semiconductor structure of the one or more first semiconductor structures has a substantially flat top surface (e.g., the top surface has a flatness less than 100 nm), a substantially vertical side surface (e.g., the side surface and the substrate define an angle that is between 75° and 105°, and sometimes between 80° and 100° or between 85° and 95°), and a diagonal surface extending from the top surface to the side surface. The diagonal surface is non-parallel and non-perpendicular to the top surface and non-parallel and non-perpendicular to the side surface (e.g., the diagonal surface and the substrate form an angle that is less than the angle formed by the side surface and the substrate). The semiconductor device also includes one or more second semiconductor structures (e.g., portions of the filling layer 308 in FIG. 3G). A respective second semiconductor structure of the one or more second semiconductor structures is located on the diagonal surface of a corresponding first semiconductor structure of the one or more first semiconductor structures. The respective second semiconductor structure has a side surface aligned with the side surface of the corresponding first semiconductor structure and a top surface aligned with the top surface of the corresponding first semiconductor structure (e.g., the side surface of the filling layer 308 and the side surface of the semiconductor structure 306 are lined up and the top surface of the filling layer 308 is level with the top surface of the semiconductor structure 306).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method for obtaining a semiconductor island, the method comprising:
    epitaxially growing one or more semiconductor structures over a substrate with one or more mask layers defining one or more regions that are not covered by the one or more mask layers over the substrate, wherein the one or more semiconductor structures are epitaxially grown over the one or more regions that are not covered by the one or more mask layers, a respective epitaxially grown semiconductor structure of the one or more epitaxially grown semiconductor structures including a first portion located adjacent to the one or more mask layers and a second portion located away from the one or more mask layers, the first portion of the respective epitaxially grown semiconductor structure having a height that is less than a height of a portion of the one or more mask layers located adjacent to the first portion of the respective epitaxially grown semiconductor structure, the second portion of the respective epitaxially grown semiconductor structure having a height that is equal to, or greater than, the height of the portion of the one or more mask layers located adjacent to the first portion of the respective epitaxially grown semiconductor structure;
    forming one or more dielectric or polysilicon filling layers directly on at least the first portion of the respective epitaxially grown semiconductor structure; and,
    subsequent to forming the one or more filling layers on at least the first portion of the respective epitaxially grown semiconductor structure, removing at least a portion of the respective epitaxially grown semiconductor structure that is located above the height of the portion of the one or more mask layers located adjacent to the first portion of the respective epitaxially grown semiconductor structure.

2. The method of claim 1, including:
    foregoing removing at least a portion of the respective epitaxially grown semiconductor structure that is located above the height of the portion of the one or more mask layers located adjacent to the first portion of the respective epitaxially grown semiconductor structure prior to forming the one or more filling layers on at least the first portion of the respective epitaxially grown semiconductor structure.

3. The method of claim 1, wherein:
    the one or more epitaxially grown semiconductor structures include germanium.

4. The method of claim 1, wherein:
    the one or more mask layers include dielectric material.

5. The method of claim 1, wherein:
    the one or more filling layers include a layer of polysilicon.

6. The method of claim 1, wherein:
    forming the one or more filling layers on at least the first portion of the respective epitaxially grown semiconductor structure includes forming at least one continuous filling layer over at least the first portion and the second portion of the respective epitaxially grown semiconductor structure and the portion of the one or more mask layers located adjacent to the first portion of the respective epitaxially grown semiconductor structure.

7. The method of claim 1, wherein the one or more semiconductor structures are formed in a single epitaxial growth process.

8. The method of claim 1, wherein:
    removing at least the portion of the respective epitaxially grown semiconductor structure includes planarizing at least the portion of the respective epitaxially grown semiconductor structure.

9. The method of claim 1, wherein the one or more semiconductor structures have crystalline structures and the one or more filling layers have amorphous and/or polycrystalline structures.

10. The method of claim 1, further comprising:
    subsequent to removing at least the portion of the respective epitaxially grown semiconductor structure, removing at least a portion of the one or more mask layers.

11. The method of claim 10, wherein removing at least the portion of the one or more mask layers includes etching at least the portion of the one or more mask layers.

12. The method of claim 11, wherein removing at least the portion of the one or more mask layers includes etching the entire one or more mask layers.

13. The method of claim 1, wherein the substrate includes a plurality of semiconductor devices thereon.

14. The method of claim 13, wherein the plurality of semiconductor devices is located on the substrate below the one or more mask layers.

15. The method of claim 13, wherein the substrate includes a plurality of transistors thereon and a semiconductor structure of the one or more semiconductor structures is electrically coupled to a source or a drain of a transistor of the plurality of transistors.

16. The method of claim 13, wherein the substrate includes thereon a plurality of complementary metal-oxide semiconductor devices, including a p-type metal-oxide-semiconductor transistor and an n-type metal-oxide-semiconductor transistor.

17. The method of claim 13, wherein:
    a semiconductor structure of the one or more semiconductor structures extends below a horizontal plane defined by a bottom of a semiconductor device of the plurality of semiconductor devices.

18. The method of claim 1, wherein:
    the respective epitaxially grown semiconductor structure has, before at least the portion of the respective epitaxially grown semiconductor structure that is located above the height of the portion of the one or more mask layers located adjacent to the first portion of the respective epitaxially grown semiconductor structure is removed, a first distance to the portion of the one or more mask layers located adjacent to the first portion of the respective epitaxially grown semiconductor structure along a plane located at the height of the portion of the one or more mask layers located adjacent to the first portion of the respective epitaxially grown semiconductor structure; and the respective epitaxially grown semiconductor structure has, after at least the portion of the respective epitaxially grown semiconductor structure that is located above the height of the portion of the one or more mask layers located adjacent to the first portion of the respective epitaxially grown semiconductor structure is removed, a second distance to the portion of the one or more mask layers located adjacent to the first portion of the respective epitaxially grown semiconductor structure along the plane located at the height of the portion of the one or more mask layers located adjacent to the first portion of the respective epitaxially grown semiconductor structure, the second distance being substantially identical to the first distance.

19. A semiconductor device, comprising:

a substrate;

one or more mask layers defining one or more regions that are not covered by the one or more mask layers over the substrate, the one or more mask layers including silicon;

one or more epitaxially grown semiconductor structures located over the one or more regions that are not covered by the one or more mask layers, the one or more semiconductor structures including germanium, a respective semiconductor structure of the one or more semiconductor structures including a first portion located adjacent to the one or more mask layers and a second portion located away from the one or more mask layers, the first portion of the respective semiconductor structure having a height that is less than a height of a portion of the one or more mask layers located adjacent to the first portion of the respective semiconductor structure, the second portion of the respective semiconductor structure having a height that is equal to, or greater than, the height of the portion of the one or more mask layers located adjacent to the first portion of the respective semiconductor structure; and one or more dielectric or polysilicon filling layers located directly on at least the first portion of the respective semiconductor structure.

\* \* \* \* \*

UNITED STATES PATENT AND TRADEMARK OFFICE
CERTIFICATE OF CORRECTION

PATENT NO. : 10,366,884 B1  
APPLICATION NO. : 16/184984  
DATED : July 30, 2019  
INVENTOR(S) : Lee et al.

Page 1 of 1

It is certified that error appears in the above-identified patent and that said Letters Patent is hereby corrected as shown below:

In the Claims

Claim 2, Column 13, Line 55, delete "foregoing removing" and insert --forgoing removing--.

Signed and Sealed this  
Twenty-second Day of October, 2019

Andrei Iancu  
*Director of the United States Patent and Trademark Office*